(12) United States Patent  
Chan et al.

(10) Patent No.: US 8,716,096 B2
(45) Date of Patent: May 6, 2014

(54) SELF-ALIGNED EMITTER-BASE IN ADVANCED BICMOS TECHNOLOGY

(75) Inventors: Kevin K. Chan, Staten Island, NY (US); David L. Harame, Essex Junction, VT (US); Russell T. Herrin, Essex Junction, VT (US); Qizhi Liu, Lexington, MA (US)

(73) Assignee: International Business Machines Corporation, Armonk, NY (US)

( * ) Notice: Subject to any disclaimer, the term of this patent is extended or adjusted under 35 U.S.C. 154(b) by 124 days.

(21) Appl. No.: 13/323,977

(22) Filed: Dec. 13, 2011

(65) Prior Publication Data

US 2013/0146947 A1      Jun. 13, 2013

(51) Int. Cl.
*H01L 21/331* (2006.01)
*H01L 21/8222* (2006.01)

(52) U.S. Cl.
USPC ..... 438/309; 438/202; 438/313; 257/E21.608

(58) Field of Classification Search
USPC .................. 438/202, 203, 309, 313, 322; 257/E21.608
See application file for complete search history.

(56) References Cited

U.S. PATENT DOCUMENTS

| | | |
|---|---|---|
| 4,170,492 A | 10/1979 | Bartlett et al. |
| 4,470,852 A | 9/1984 | Ellsworth |
| 5,128,271 A | 7/1992 | Bronner et al. |
| 5,162,245 A | 11/1992 | Favreau |
| 5,358,894 A | 10/1994 | Fazan et al. |
| 5,391,503 A | 2/1995 | Miwa et al. |
| 5,420,454 A | 5/1995 | Vook et al. |
| 5,494,836 A | 2/1996 | Imai |
| 5,506,427 A | 4/1996 | Imai |
| 5,599,723 A | 2/1997 | Sato |
| 5,648,280 A | 7/1997 | Kato |
| 5,656,514 A | 8/1997 | Ahlgren et al. |
| 5,668,022 A | 9/1997 | Cho et al. |

(Continued)

FOREIGN PATENT DOCUMENTS

| | | |
|---|---|---|
| JP | 61269374 | 11/1986 |
| JP | 64053454 | 3/1989 |

(Continued)

OTHER PUBLICATIONS

McCall Shepard, Office Action Communication for U.S. Appl. No. 12/817,249 dated Jun. 21, 2012, 16 pages.

(Continued)

*Primary Examiner* — Hoai V Pham
(74) *Attorney, Agent, or Firm* — Michael J. LeStrange; Hoffman Warnick LLC

(57) ABSTRACT

A self-aligned bipolar transistor and method of fabricating the same are disclosed. In an embodiment, a substrate and an intrinsic base are provided, followed by a first oxide layer, and an extrinsic base over the first oxide layer. A first opening is formed, exposing a portion of a surface of the extrinsic base. Sidewall spacers are formed in the first opening, and a self-aligned oxide mask is selectively formed on the exposed surface of the extrinsic base. The spacers are removed, and using the self-aligned oxide mask, the exposed extrinsic base and the first oxide layer are etched to expose the intrinsic base layer, forming a first and a second slot. A silicon layer stripe is selectively grown on the exposed intrinsic and/or extrinsic base layers in each of the first and second slots, substantially filling the respective slot.

13 Claims, 11 Drawing Sheets

(56) References Cited

U.S. PATENT DOCUMENTS

| | | |
|---|---|---|
| 5,668,396 A | 9/1997 | Sato |
| 5,721,147 A | 2/1998 | Yoon |
| 5,723,378 A | 3/1998 | Sato |
| 5,766,999 A | 6/1998 | Sato |
| 5,789,800 A | 8/1998 | Kohno |
| 5,798,561 A | 8/1998 | Sato |
| 5,821,149 A | 10/1998 | Schuppen et al. |
| 5,834,800 A | 11/1998 | Jalali-Farahani et al. |
| 5,846,869 A | 12/1998 | Hashimoto et al. |
| 5,869,385 A | 2/1999 | Tang et al. |
| 5,962,880 A | 10/1999 | Oda et al. |
| 5,963,817 A | 10/1999 | Chu et al. |
| 6,121,101 A | 9/2000 | King et al. |
| 6,177,325 B1 | 1/2001 | Jang |
| 6,281,097 B1 | 8/2001 | Aoyama |
| 6,287,929 B1 | 9/2001 | Kato |
| 6,329,698 B1 | 12/2001 | Koscielniak et al. |
| 6,337,251 B1 | 1/2002 | Hashimoto |
| 6,346,453 B1 | 2/2002 | Kovacic et al. |
| 6,380,017 B1 | 4/2002 | Darwish et al. |
| 6,383,855 B1 | 5/2002 | Gao et al. |
| 6,388,307 B1 | 5/2002 | Kondo et al. |
| 6,404,039 B1 | 6/2002 | Fujii |
| 6,461,888 B1 | 10/2002 | Sridhar et al. |
| 6,465,870 B2 | 10/2002 | Voldman |
| 6,475,848 B1 | 11/2002 | Darwish et al. |
| 6,559,020 B1 | 5/2003 | Salmi |
| 6,603,188 B1 | 8/2003 | Darwish et al. |
| 6,610,143 B2 | 8/2003 | Zdebel et al. |
| 6,730,986 B2 | 5/2004 | Park |
| 6,828,602 B2 | 12/2004 | Asai et al. |
| 6,960,820 B2 | 11/2005 | Freeman et al. |
| 6,972,443 B2 | 12/2005 | Khater |
| 7,037,798 B2 | 5/2006 | Adam et al. |
| 7,087,940 B2 | 8/2006 | Khater et al. |
| 7,119,416 B1 | 10/2006 | Adam et al. |
| 7,566,626 B1 | 7/2009 | Xu et al. |
| 7,611,954 B2 | 11/2009 | Freeman et al. |
| 7,709,338 B2 | 5/2010 | Liu et al. |
| 2001/0053584 A1 | 12/2001 | Chantre et al. |
| 2005/0012180 A1 | 1/2005 | Freeman et al. |
| 2005/0082642 A1 | 4/2005 | Freeman et al. |
| 2008/0265282 A1 | 10/2008 | Gluschenkov et al. |
| 2011/0309471 A1 | 12/2011 | Camillo-Castillo et al. |
| 2011/0312147 A1 | 12/2011 | Harame et al. |
| 2013/0009280 A1* | 1/2013 | Camillo-Castillo et al. .. 257/565 |

FOREIGN PATENT DOCUMENTS

| | | |
|---|---|---|
| JP | 6124956 | 5/1994 |
| JP | 2002270615 A | 9/2002 |
| JP | 2002313799 A | 10/2002 |

OTHER PUBLICATIONS

McCall Shepard, Office Action Communication for U.S. Appl. No. 12/817,249 dated Mar. 29, 2012, 7 pages.

Chevalier et al., "Si/SiGe HBTs for Millimeter-wave BiCMOS Technologies," Jun. 2008, pp. 195-198, Device Research Conference, (XB031436908).

Patent Cooperation Treaty, PCT International Search Report for PCT/US2011/036729 dated Jul. 13, 2011, 1 page.

McCall, Office Action Communication for U.S. Appl. No. 12/967,268 dated Dec. 7, 2012, 11 pages.

McCall, Notice of Allowance and Fee(s) due for U.S. Appl. No. 12/817,249 dated Nov. 20, 2012, 10 pages.

McCall, Notice of Allowance and Fee(s) Due for U.S. Appl. No. 12/967,268 dated Apr. 12, 2013, 16 pages.

* cited by examiner

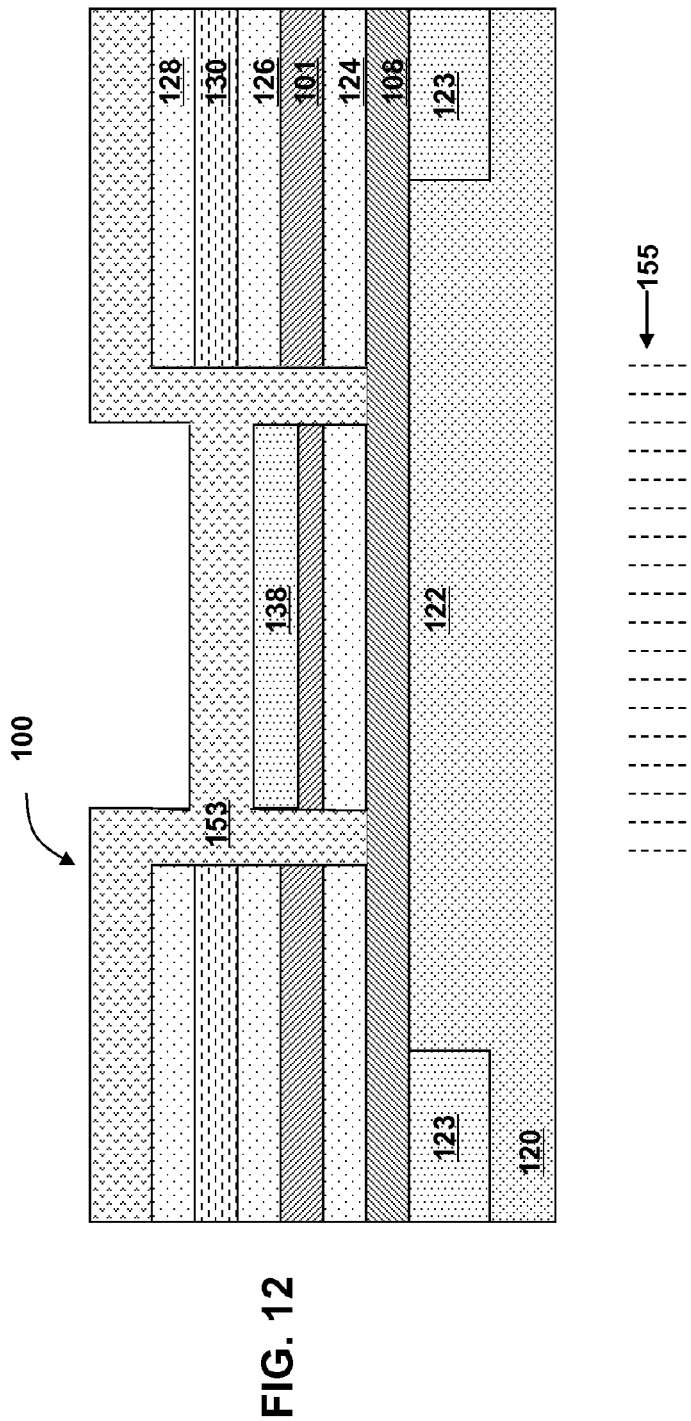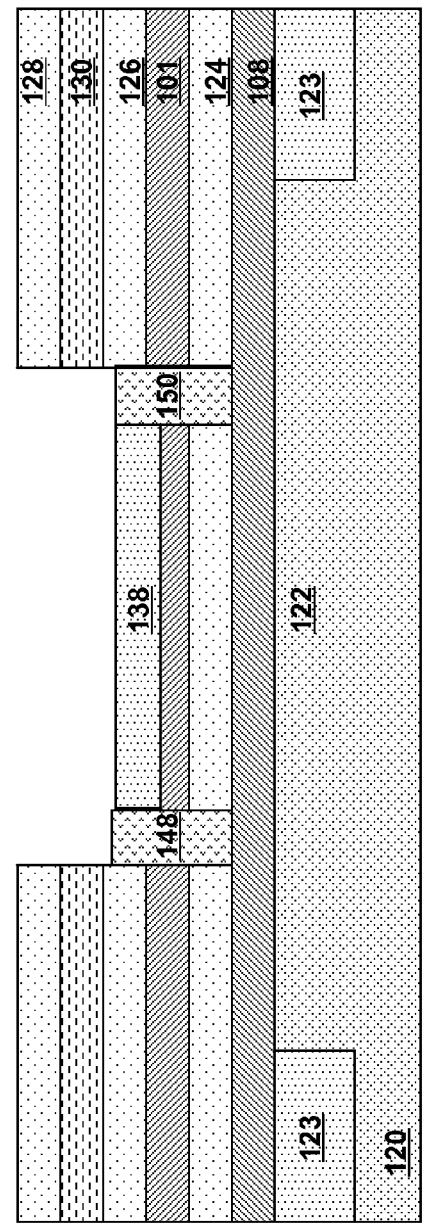

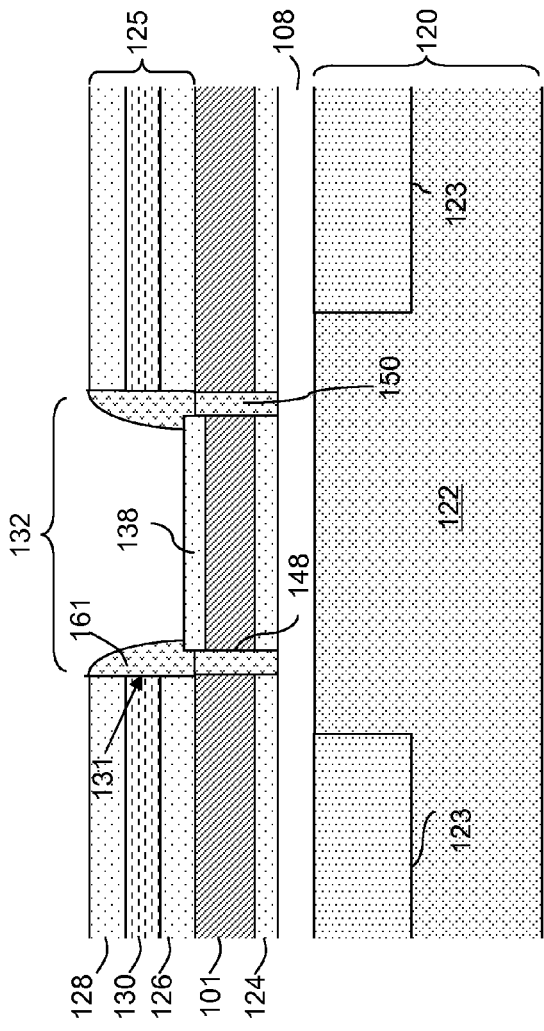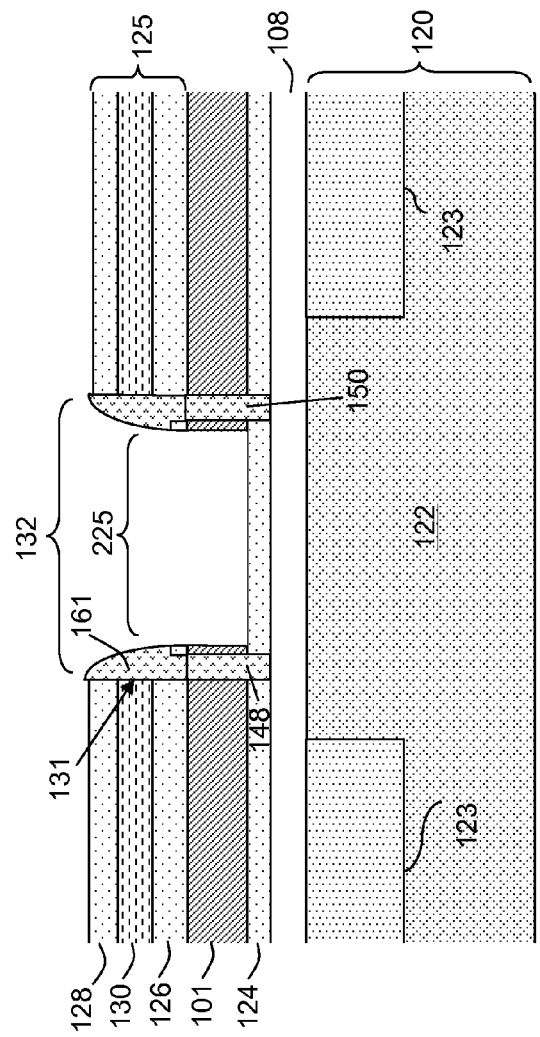

SELF-ALIGNED EMITTER-BASE IN ADVANCED BICMOS TECHNOLOGY

BACKGROUND OF THE INVENTION

The invention relates generally to self-aligned bipolar transistors. More particularly, the invention relates to self-aligned emitter-base transistors having a selectively grown silicon link between the intrinsic and extrinsic bases.

Bipolar transistors having, for example, a silicon germanium (SiGe) intrinsic base and a polysilicon extrinsic base are frequently used in integrated circuits fabricated for high performanced mixed signal applications. In bipolar transistors (BTs) and high performance heterojunction bipolar transistors (HBTs), it is desirable to have relatively small size, high cutoff frequency ($F_t$) and maximum oscillation frequency ($F_{max}$). $F_{max}$ is a function of $F_t$ and of parasitics, including parasitic capacitances and parasitic resistances. Exemplary parasitics include but are not limited to: collector-base capacitance $C_{cb}$, base-emitter $C_{be}$ capacitance, and base resistance $R_b$. It has been a challenge, however, to fabricate very small transistors that operate in, for example, the 90 nanometer (nm) technology node, which are capable of accurately amplifying electrical signals at a frequency of about 300 GHz, and of being integrated with 90 nm CMOS devices as well as other passives and other features.

BRIEF DESCRIPTION OF THE INVENTION

A first aspect of the disclosure provides a method of fabricating a self-aligned bipolar transistor. The method includes: providing a substrate, and providing a stack of films disposed above the substrate, the stack of films including an intrinsic base over the substrate, a first oxide layer over the intrinsic base, an extrinsic base over the first oxide layer, a second oxide layer over the extrinsic base, a nitride layer over the second oxide layer, and a third oxide layer over the nitride layer. A first opening is formed in the third oxide layer, the nitride layer, and the second oxide layer, exposing a surface of the extrinsic base. A spacer is formed on a sidewall of the first opening, and a self-aligned oxide mask is formed on the exposed surface of the extrinsic base. The spacer is then removed, and using the self-aligned oxide mask, the exposed extrinsic base and the first oxide layer are etched to expose the intrinsic base layer, forming a first slot and a second slot. A silicon layer stripe is selectively grown in each of the first and second slots, wherein the silicon layer stripe in each of the first and second slots substantially fills the first and second slots.

A second aspect of the disclosure provides a method of fabricating a self-aligned bipolar transistor. The method comprises forming a first opening to expose a surface of an extrinsic base region, and forming a spacer on a sidewall of the first opening. A self-aligned oxide mask is formed on the exposed surface of the extrinsic base, and the spacer is removed. The self-aligned oxide mask is then used to form a self-aligned first slot and a self-aligned second slot extending vertically through a thickness of the exposed extrinsic base and a first oxide layer to expose an intrinsic base layer. A silicon layer stripe is then selectively grown on at least one of the exposed intrinsic base layer and extrinsic base layer in each of the first slot and the second slot, wherein the silicon layer stripe in each of the first and second slots substantially fills the first and second slots.

A third aspect of the disclosure provides a self-aligned bipolar transistor comprising: an intrinsic base layer disposed above a substrate; an oxide layer disposed above the intrinsic base layer; an extrinsic base layer disposed above the oxide layer; a first slot and a second slot extending vertically through a thickness of each of the extrinsic base layer and the oxide layer; and a silicon layer stripe disposed in each of the first slot and the second slot, wherein the silicon layer stripe is selectively grown on a surface of at least one of the intrinsic base layer and the extrinsic base layer, wherein the silicon layer stripe in each of the first and second slots substantially fills the first and second slots.

These and other aspects, advantages and salient features of the invention will become apparent from the following detailed description, which, when taken in conjunction with the annexed drawings, where like parts are designated by like reference characters throughout the drawings, disclose embodiments of the invention.

BRIEF DESCRIPTION OF THE DRAWINGS

FIGS. 12-13 show cross sectional views of a partially completed bipolar transistor in accordance with embodiments of the invention.

FIGS. 15-20 show cross-sectional views of a partially completed bipolar transistor in accordance with embodiments of the invention.

DETAILED DESCRIPTION OF THE INVENTION

Figure 1:
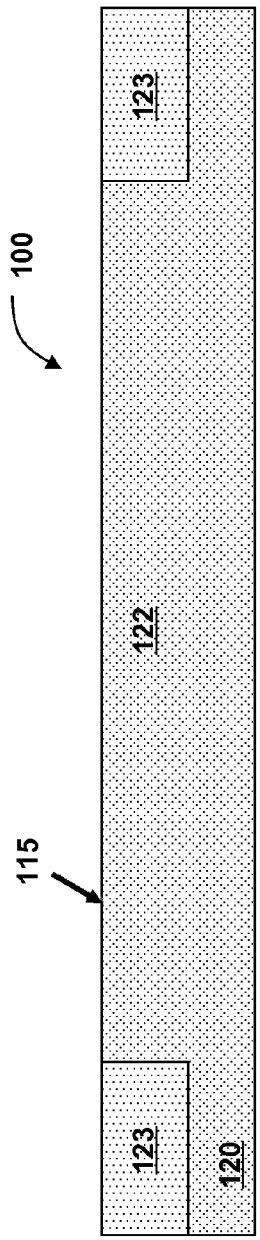
FIGS. 1-11 show cross-sectional views of a partially completed bipolar transistor formed in accordance with embodiments of the invention.

The embodiments of the invention and the various features thereof are explained more fully with reference to the embodiments depicted in the drawings.

As discussed above, it is desirable in bipolar transistors (BTs), and particularly in high performance heterojunction bipolar transistors (HBTs) to have a relatively high cutoff frequency ($F_t$) and maximum oscillation frequency ($F_{max}$). With reference to FIGS. 1-7, embodiments of the disclosure provide an improved transistor 100 and a method for fabricating transistor 100.

Referring to FIG. 1, embodiments of transistor 100 (which may be a BT or an HBT structure) include a substrate 120 having a first conductivity type (e.g., P-type conductivity). For example, substrate 120 may be crystalline silicon, or more specifically, P-silicon (i.e., silicon lightly doped with a P-type dopant). Substrate 120 may further comprise a collector region 122 having a second conductivity type, which is different from the first conductivity type (e.g., N-type conductivity). Various configurations of BT and HBT collector regions 122 are known in the art and may be incorporated into transistor 100. For example, collector region 122 may include a single N-well region, or multiple N-type collector components. Shallow trench isolation (STI) regions 123 can optionally be positioned within and at the top surface 115 of the semiconductor substrate 120 to define the active area of the device. Specifically, the STI regions 123 can comprise relatively shallow trenches patterned and etched into the top surface of the substrate 120 around (i.e., bordering) an area designated as the active area of the device. The trenches can be lined (optionally) and filled with one or more isolation materials (e.g., a silicon oxide material, a silicon nitride material, a silicon oxynitride material or any other suitable isolation material or combination thereof).

Figure 2:
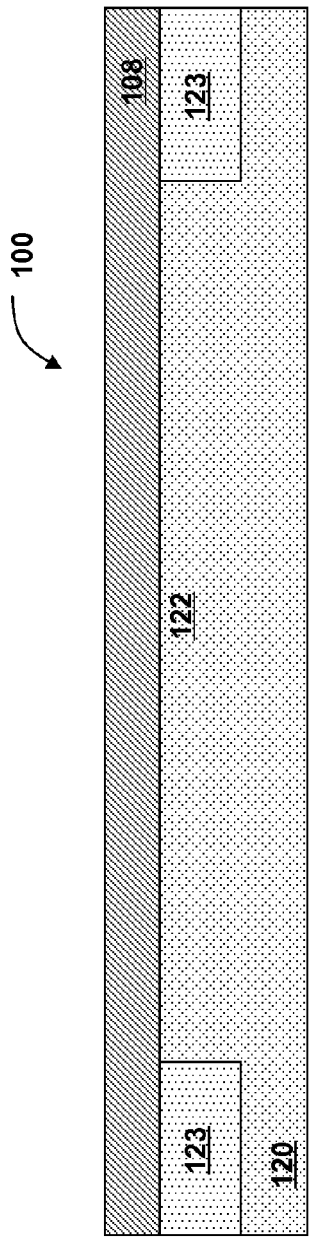

As shown in FIG. 2, intrinsic base layer 108, having the first conductivity type (e.g., P-type conductivity), is disposed on top of surface 115 of substrate 120, above and in electrical contact with collector region 122. Intrinsic base layer 108 may further extend laterally over STI regions 123. Intrinsic base layer 108 may comprise silicon (Si) or silicon germanium (SiGe), and may be formed, e.g., by a contemporaneous epitaxy process or subsequent implantation. Intrinsic base layer 108 may further be doped with a predetermined concentration of P-type dopant.

Figure 3:
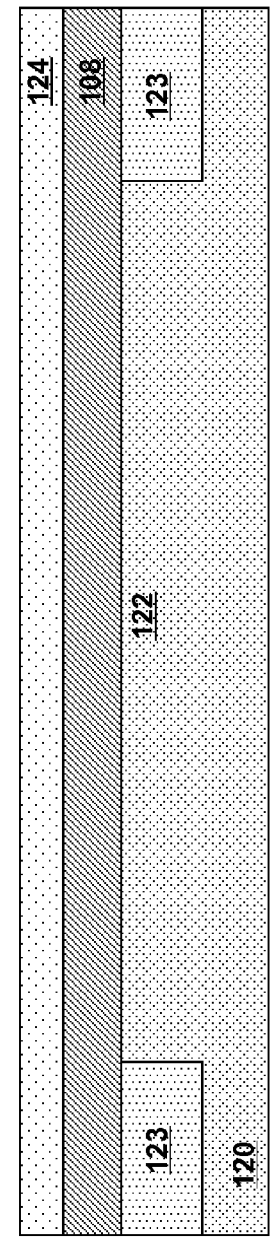
Figure 4:
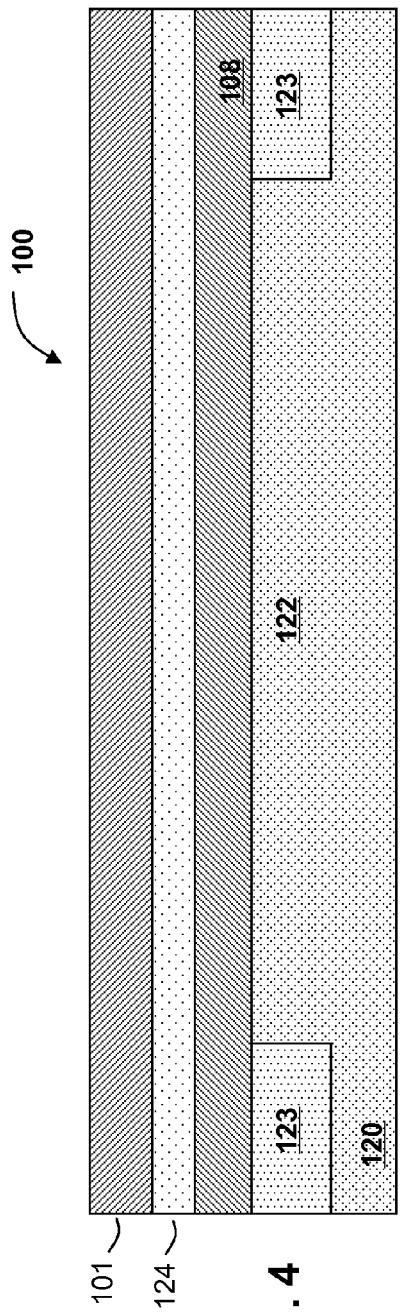

As shown in FIG. 3, first oxide layer 124 may be deposited over intrinsic base layer 108. First oxide layer 124 may comprise, e.g., an oxide such as silicon oxide or silicon germanium oxide, as appropriate to the composition of intrinsic base layer 108. As shown in FIG. 4, a raised extrinsic base layer 101, having the same conductivity type (e.g., P-type conductivity) as intrinsic base layer 108, may be deposited above first oxide layer 124. First oxide layer 124 thus physically separates intrinsic base layer 108 and extrinsic base layer 101. Extrinsic base layer 101 may be silicon or polysilicon in various embodiments. In one embodiment, extrinsic base layer 101 may be, e.g., heavily P+ doped polysilicon, and intrinsic base layer 108 may be P+ doped SiGe, forming part of an NPN transistor 100.

Figure 5:
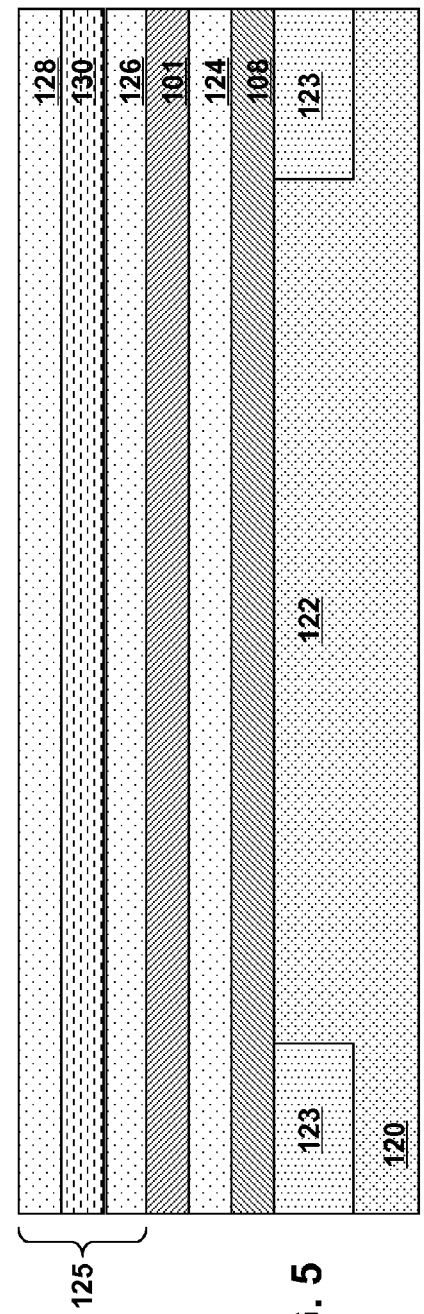

As shown in FIG. 5, at least one dielectric layer, and preferably a stack 125 of dielectric layers is deposited over extrinsic base layer 101 using conventional deposition processes. Stack 125 may include second oxide layer 126 (which may include silicon oxide) disposed over extrinsic base 101, nitride layer 130 (which may include silicon nitride) disposed over second oxide layer 126, and third oxide layer 128 (which may include silicon oxide) disposed over nitride layer 130. Each layer is deposited at least over intrinsic base layer 108.

Figure 6:
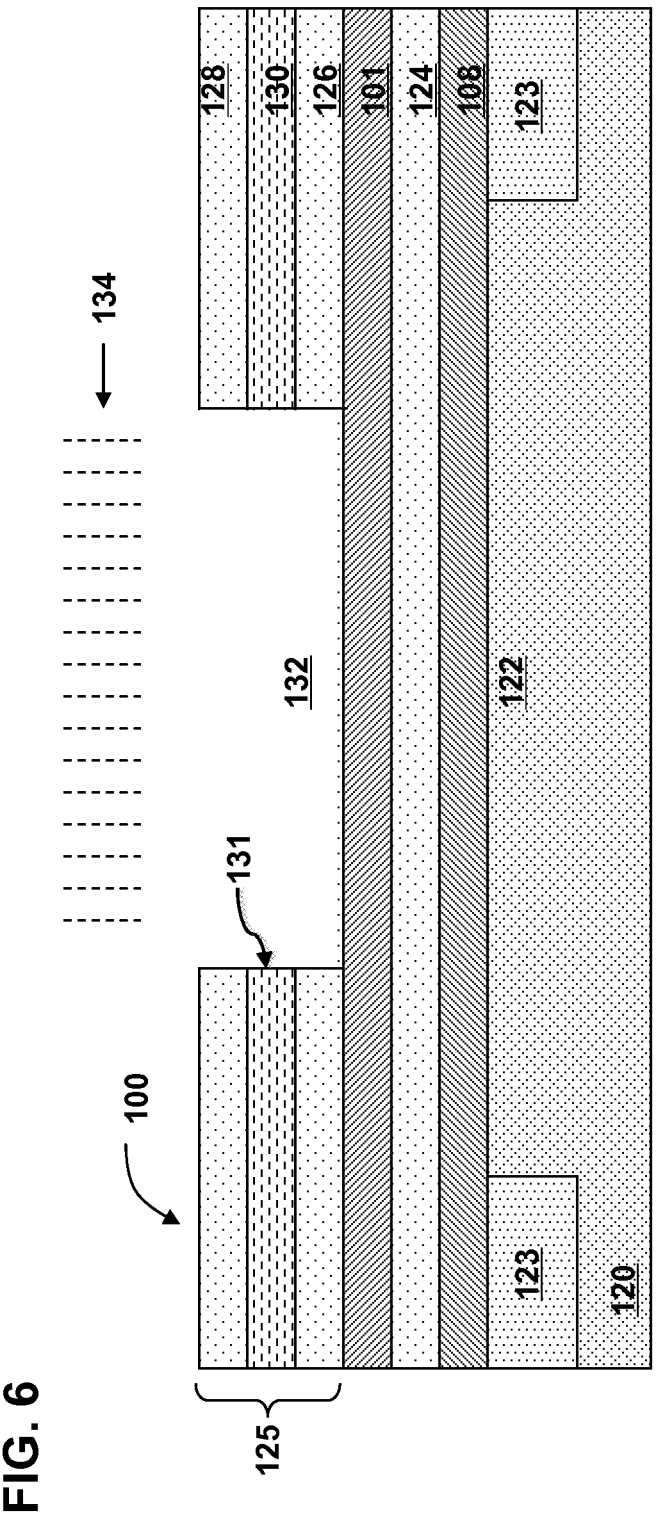
Figure 7:
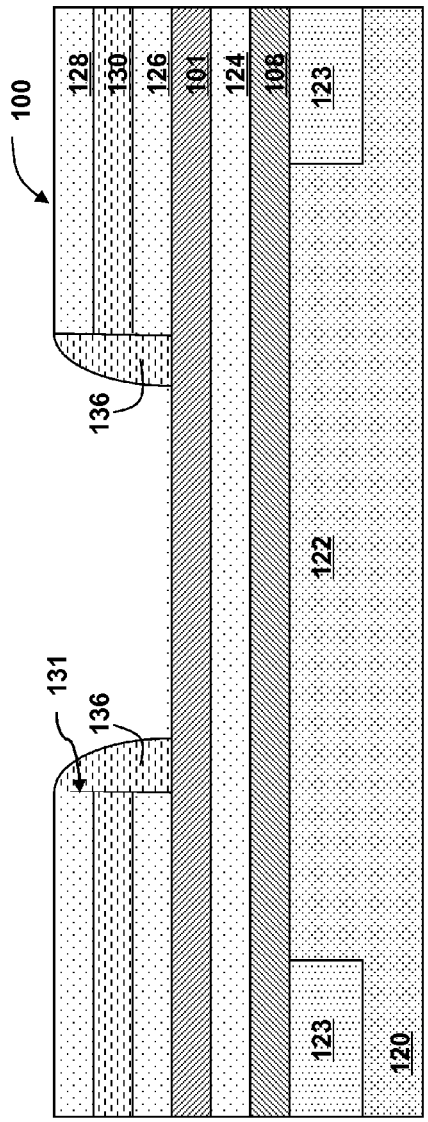
Figure 8:
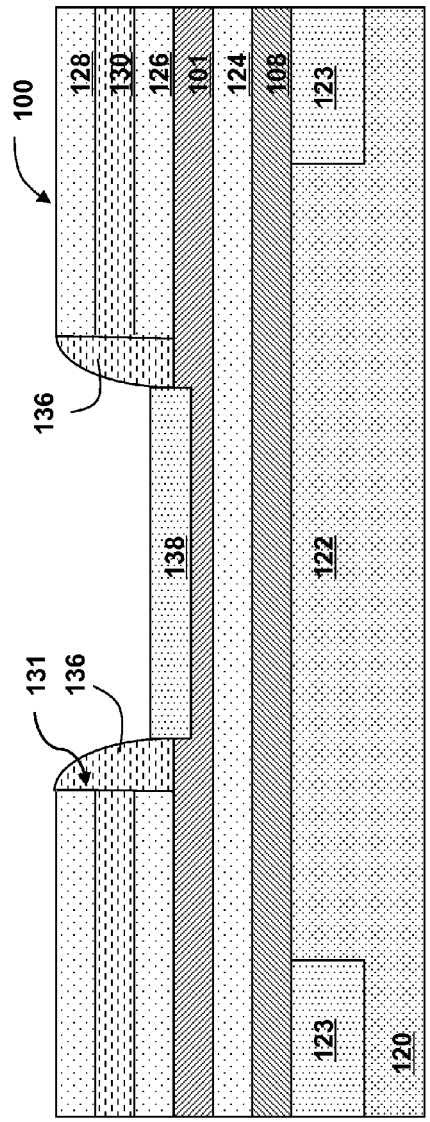

As shown in FIG. 6, a first opening 132 is formed in oxide-nitride-oxide stack 125 using an etch 134, exposing a portion of the upper surface of extrinsic base 101, and forming vertical sidewalls 131. This may be done using a mask to pattern first opening 132 so that it is positioned above collector region 122, and further, so that it may be substantially centered between STI regions 123. An anisotropic etch, such as a reactive ion etch (RIE) may be used to etch through the one or more dielectric layers in stack 125. As shown in FIG. 7, sacrificial spacers 136 are formed on the sidewalls 131 of first opening 132, according to conventional methods. In an embodiment, sidewall spacers 136 may include a nitride such as silicon nitride. As shown in FIG. 8, after the spacers 136 are formed, a self-aligned oxide mask 138 is formed on the exposed surface of extrinsic base 101. In an embodiment, self-aligned oxide mask 138 may be formed using HI Pressure OXidation (HIPOX) to oxidize a polysilicon extrinsic base 101, resulting in a silicon oxide mask 138 grown on a polysilicon extrinsic base 101.

Figure 9:
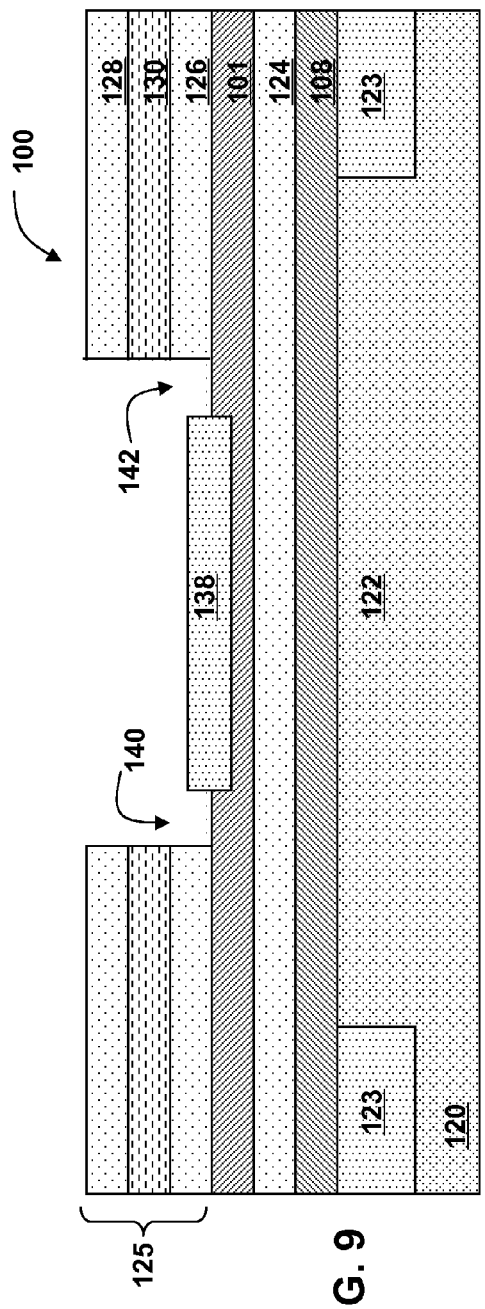

As shown in FIG. 9, spacers 136 may then be selectively removed using, e.g., a wet etch such as hot phosphoric acid, or reactive ion etching (RIE). After spacers 136 are removed, the exposed portions 140, 142 of extrinsic base layer 101 are the only exposed silicon material on the device; oxide mask 138 and the remaining portions of stack 125 protect the balance of extrinsic base layer 101.

Figure 10:
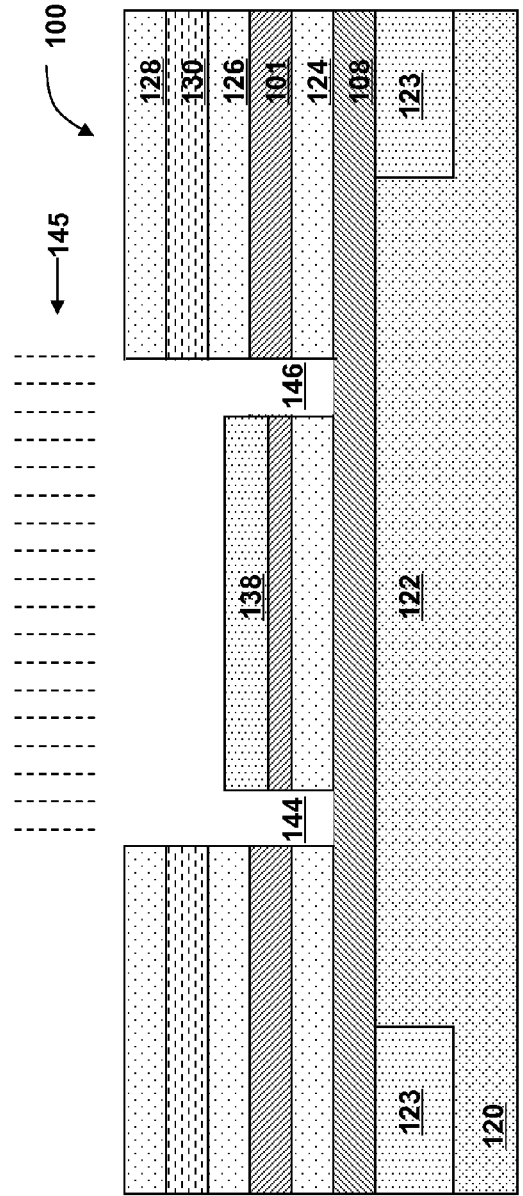

As shown in FIG. 10, using self-aligned oxide mask 138, the exposed portions 140, 142 (FIG. 9) of extrinsic base layer 101 and the underlying portions of first oxide layer 124 are etched 145 to expose a portion of a surface of intrinsic base layer 108 in first slot 144 and a second slot 146. Etch 145 may be an anisotropic etch such as RIE. Thus, the resulting first and second slots 144, 146 substantially conform to the perimeter of first opening 132, such that it is substantially annular with respect to first opening 132.

Figure 11:
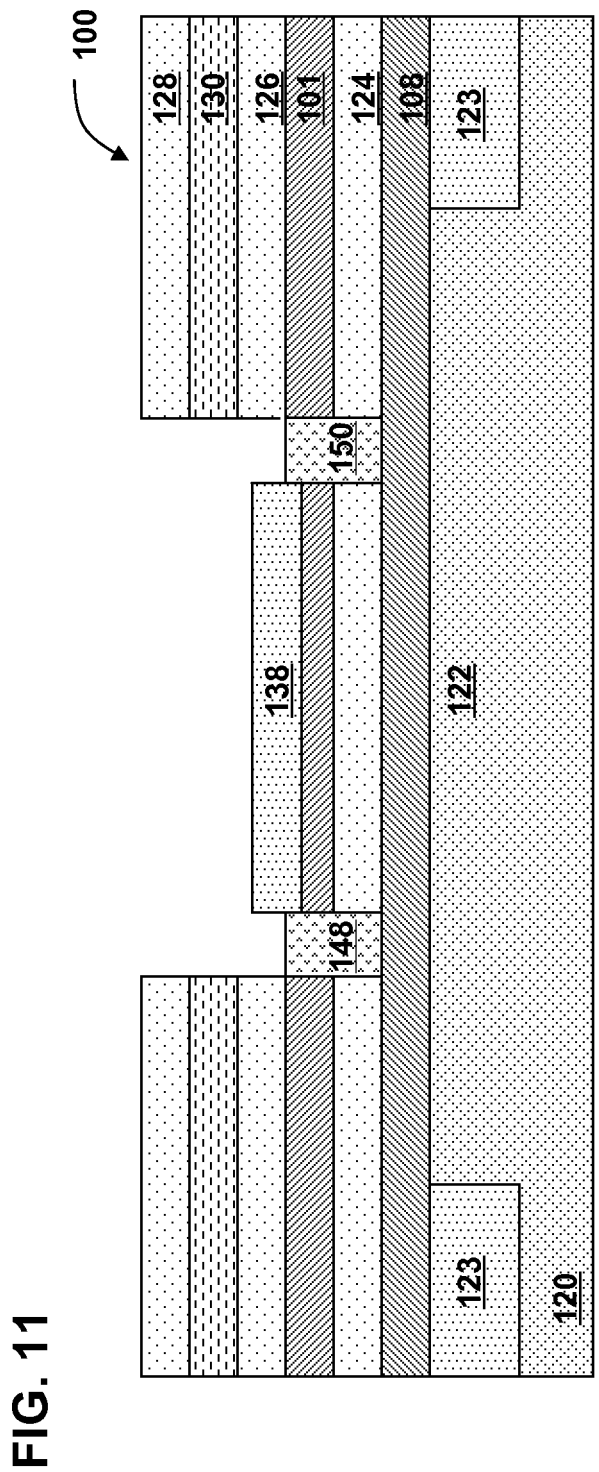

As shown in FIG. 11, silicon layer stripes 148, 150 may be selectively grown on the exposed portions of at least one of intrinsic base layer 108 and extrinsic base layer 101 in each of the first and second slots 144, 146 (labeled in FIG. 10) Silicon layer stripes 148, 150 substantially fill each of first and second slots 144, 146 without overburdening first and second slots 144, 146. In other words, slots 144, 146 are not overfilled; rather, the entirety of silicon layer stripes 148, 150 can be contained within first and second slots 144, 146 respectively. In various embodiments, silicon layer stripes 148, 150 may include one of Si or SiGe. In further embodiments, the Si or SiGe silicon layer stripes 148, 150 may be doped in situ with boron or other dopants as known in the art to further reduce base resistance ($R_b$). Silicon layer stripes 148, 150 provide a link placing intrinsic base 108 and extrinsic base 101 in electrical signal communication.

Figure 14:
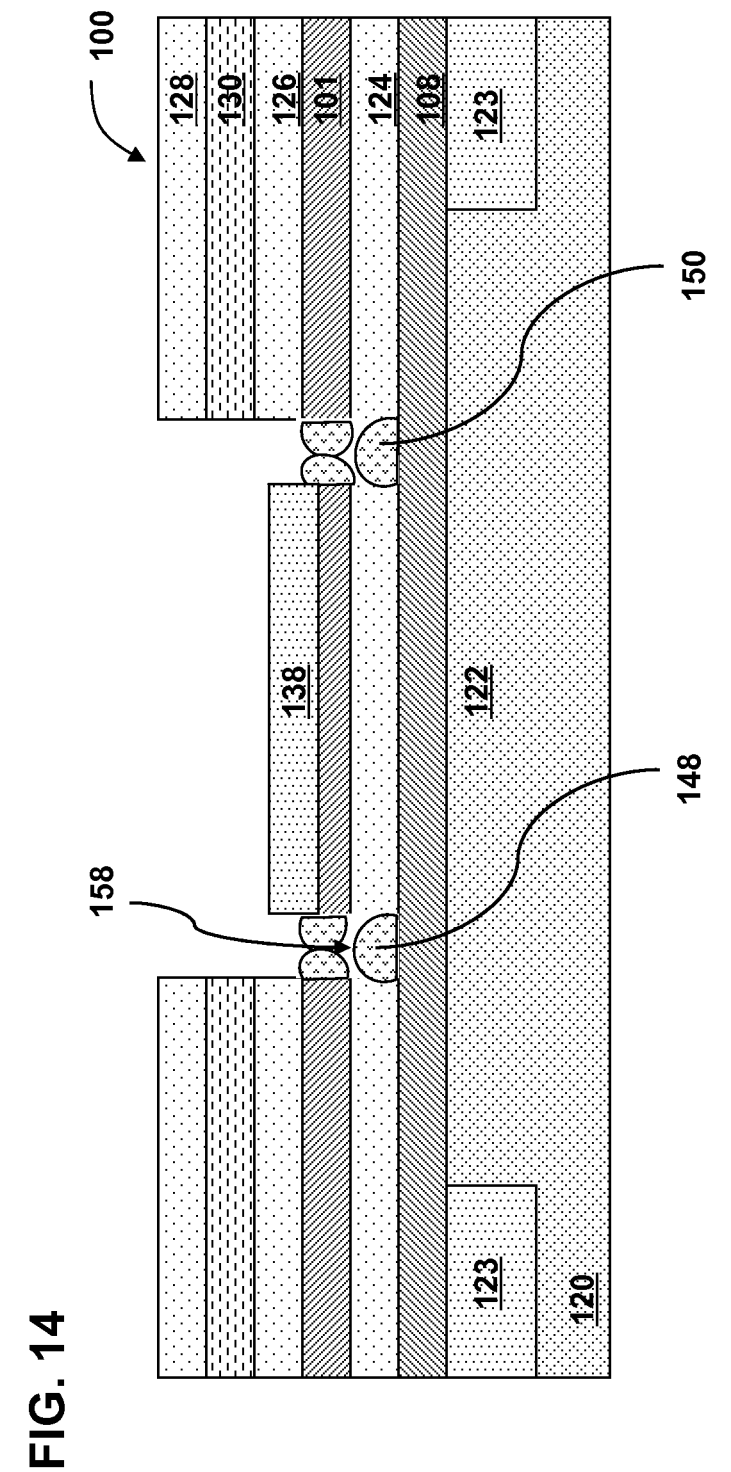
FIG. 14 shows a cross sectional view of a partially completed bipolar transistor having a gap in a silicon layer stripe.

As mentioned above, the step shown in FIG. 11 includes selectively growing silicon layer stripes 148, 150 without overburdening first and second slots 144, 146, in contrast with the embodiment of FIGS. 12-13, which illustrates a non-selective deposition of silicon layer stripes with over burden 153 (FIG. 12), followed by an isotropic etch 155 (FIG. 13) to remove silicon overburden 153 above slots 144, 146. Referring back to FIG. 11, as noted, silicon layer stripes 148, 150 are instead selectively grown on exposed surfaces of one or both of intrinsic base layer 108 and extrinsic base layer 101. Accordingly, pressure, among other conditions in the chamber, may be adjusted as known and practiced in the art to allow for control of selective growth of silicon layer stripes 148, 150 as shown in FIG. 11. For example, a rate of growth inward from the sides of first and second slots 144, 146 in contact with extrinsic base layer 101, and a rate of growth upward from intrinsic base 108 must be controlled so as to form substantially solid silicon layer stripes 148, 150 as shown in FIG. 11, and so as to avoid forming silicon layer stripes 148, 150 that include a void 158 in a center of first and/or second slot 144, 146 as shown in FIG. 14.

Figure 17:
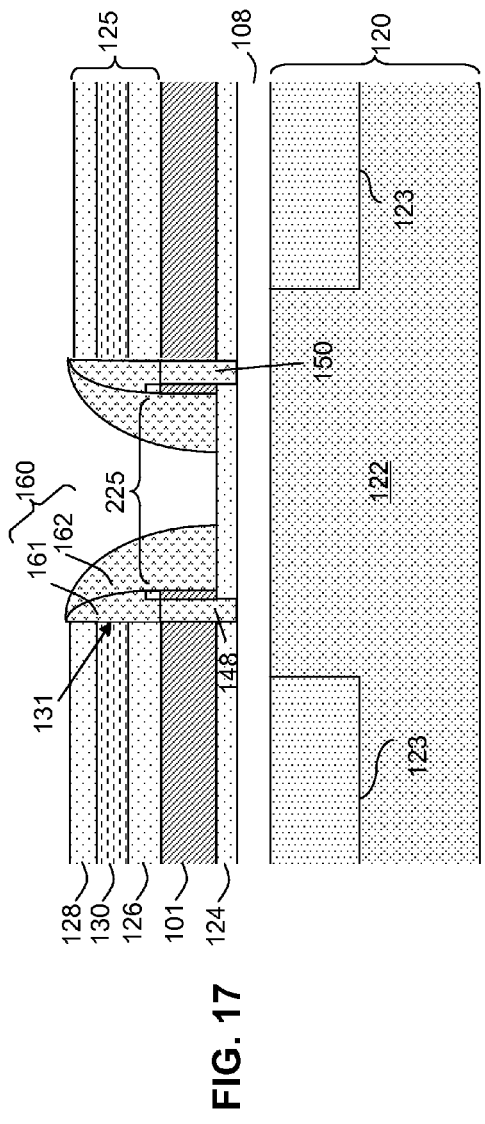

FIGS. 15-20 depict further processing steps for forming an emitter above collector region. As shown in FIGS. 15-17, after silicon layer stripes 148, 150 are formed, conventional sidewall spacer formation techniques can be used to form a first portion 161 of a dielectric spacer 160 on the first vertical sidewall 131 of the first opening 132 so that it is above silicon layer stripes 148, 150. For example, a nitride layer can be deposited and an anisotropic etch process (e.g., a reactive ion etch (RIE) process) can be performed in order to shape the first portion 161 of the dielectric spacer 160, covering the entirety of the top surface of silicon layer stripes 148, 150.

As shown in FIG. 16, a second opening 225 can be formed within the first opening 132 by selectively removing exposed portions of the sacrificial dielectric layer 138 (FIG. 15) and the extrinsic base layer 101 not protected by the first portion 161 of the dielectric spacer 160. This can be accomplished by performing selective anisotropic etch processes (e.g., selective reactive ion etch (RIE) processes), stopping on the first oxide layer 124. As shown in FIG. 17, a second portion 162 of the dielectric spacer 160 can be formed in the second opening 225 on the exposed first oxide layer 124 and positioned laterally adjacent to the first portion 161 and the extrinsic base layer 101. This can be accomplished, for example, by depositing a nitride layer and performing an anisotropic etch process (e.g., a reactive ion etch (RIE) process) in order to shape the second portion 161 of the dielectric spacer 160.

Figure 18:
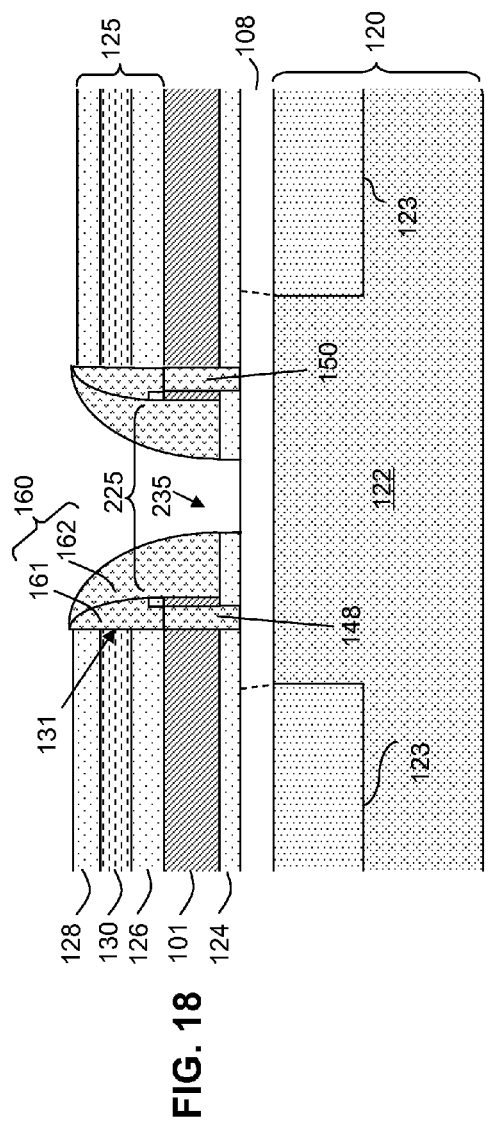

As shown in FIG. 18, after dielectric spacer 160 is formed, a third opening 235 (i.e., an emitter layer opening) can be formed by selectively removing any exposed first oxide layer 124 not protected by the second portion 161 of the dielectric spacer 160. This can be accomplished by performing a selective anisotropic etch process (e.g., a selective reactive ion etch (RIE) process), stopping on the intrinsic base layer 108.

Figure 19:
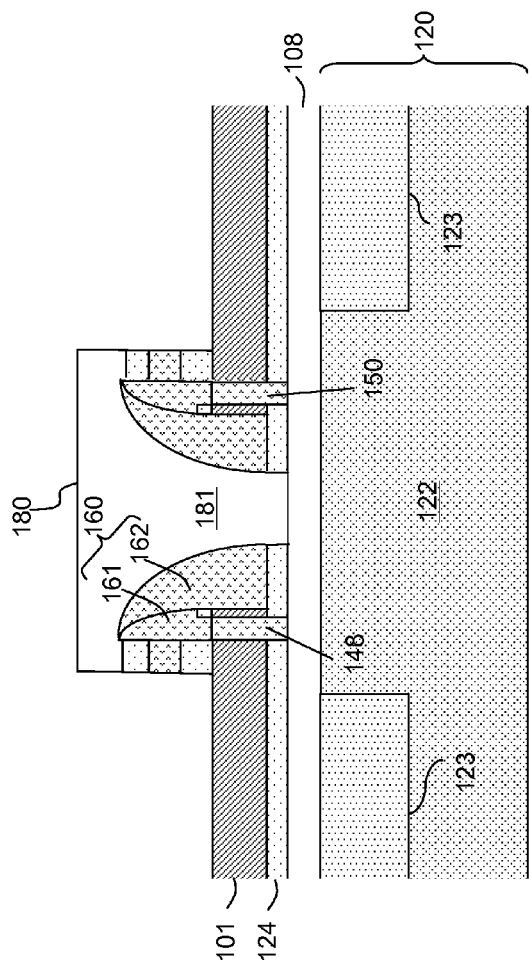
Figure 20:
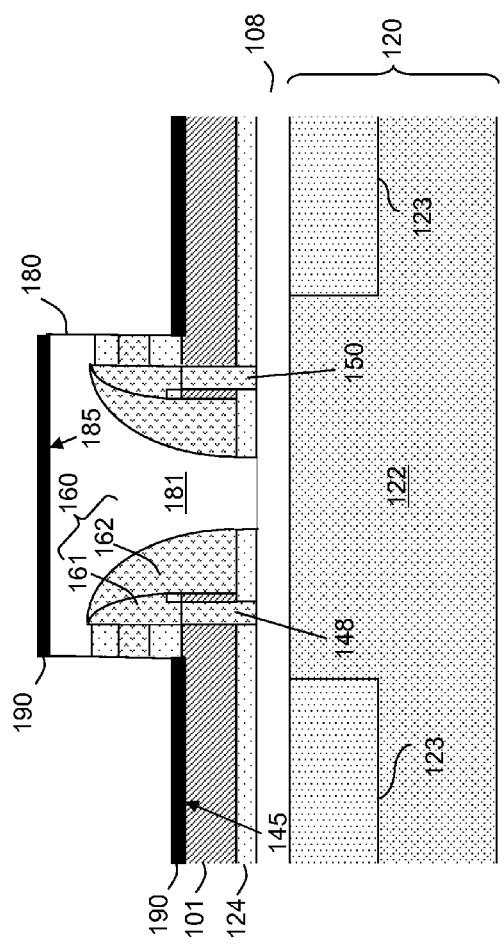

As shown in FIG. 19, emitter layer 180, having a same conductivity type as collector region 122 (e.g. N-type conductivity), can be formed on the exposed intrinsic base layer 108 within the emitter layer opening 235 (FIG. 18) such that it is positioned laterally adjacent to the first oxide layer 124 and dielectric spacer 160. Thus, the first oxide layer 124 and dielectric spacer 160 electrically isolate the emitter layer 180 from the extrinsic base layer 101 and silicon layer stripes 148, 150. This can be accomplished by depositing a semiconductor layer so as to fill the emitter layer opening 235 and the remaining space within the first and second openings 132, 225, as defined by the dielectric spacer 160. The geometry of the emitter layer 180 is essentially defined by the dielectric spacer 160 because the second portion 161 of the dielectric spacer 160 functions as a mask for defining the emitter layer opening 235 and, thereby defines the width (i.e., diameter) of the relatively narrow lower portion 181 (FIG. 19) of emitter layer 180 in contact with the intrinsic base layer 108.

After the emitter layer 180 is formed, additional processing can be performed to complete the transistor 100. This additional processing can also include, but is not limited to, silicide layer 190 formation (FIG. 20), interlayer dielectric formation, contact formation (not shown), etc. For example, to form the silicide layers 190, a mask can be formed over the top surface 185 of the emitter layer 180 and the stack 125 of one or more dielectric layers can be etched back to expose the top surface 145 of the raised extrinsic base layer 101. Then, the mask can be removed and a cobalt, platinum, nickel or other suitable conducting metal silicide layer can be formed, using conventional metal silicide processing techniques, on the exposed surfaces of the extrinsic base layer 101 and emitter layer 180.

In addition to the method provided in FIGS. 1-11, also provided is the transistor 100 fabricated according to that method. Transistor 100 may include intrinsic base layer 108 disposed above substrate 120. Substrate 120 may include shallow trench isolations 123, with collector region 122 there between. First oxide layer 124 may be disposed above intrinsic base layer 108, and extrinsic base layer 101 may be disposed above first oxide layer 124. Additional layers, such as second oxide layer 126, nitride layer 130, and third oxide layer 128 may be disposed sequentially above extrinsic base layer 101. A first slot 144 and a second slot 146 (labeled in FIG. 10) may extend vertically through the full thickness of each of extrinsic base layer 101 and first oxide layer 124. Silicon layer stripes 148, 150 may be disposed in each of first and second slots 144, 146, and each substantially fill first and second slots 144, 146 respectively with substantially no overgrowth above the slots. As discussed above, silicon layer stripes 148, 150 are selectively grown on a surface of intrinsic base layer 108, rather than deposited as a blanket over the device, and may comprise one of Si or SiGe. The depth of silicon layer stripes 148, 150 can be controlled via a variety of factors including pressure in the chamber during growth. In some embodiments, the silicon layer stripes 148, 150 may be doped in situ with boron to further reduce signal resistance. Silicon layer stripes 148, 150 provide an electrical signal connection between intrinsic base layer 108 and extrinsic base layer 101, and therefore between a subsequently-formed emitter 180 (FIG. 20), base, and collector region (122) in transistor 100.

It should be understood that in the above-described embodiments, any component formed with an N-type conductivity will be doped (e.g., either in-situ doped, subsequently implanted, etc.) with an N-type conductivity dopant, and any component formed with a P-type conductivity will be doped (e.g., either in-situ doped, subsequently implanted, etc.) with a P-type conductivity dopant. Such N-type conductivity dopants can comprise, for example, Group V dopants, such as arsenic (As), phosphorous (P) or antimony (Sb) and such P-type conductivity dopants can comprise, for example, Group III dopants, such as boron (B) or indium (In)).

It should further be understood that the terminology used herein is for the purpose of describing particular embodiments only and is not intended to be limiting of the invention. For example, for illustration purposes, the transistor 100 was described in detail above with respect to an NPN transistor (i.e., a transistor in which the collector has an N-type conductivity, the base has a P-type conductivity and the emitter has an N-type conductivity). Similarly, the method of the present invention was described in detail above with respect to forming an NPN transistor. However, it should be understood that this description is not intended to be limiting and that the novel structure and method could also apply to a PNP transistor (i.e., a transistor in which the collector has a P-type conductivity, the base has an N-type conductivity and the emitter has a P-type conductivity).

As used herein, the terms "first," "second," and the like, do not denote any order, quantity, or importance, but rather are used to distinguish one element from another, and the terms "a" and "an" herein do not denote a limitation of quantity, but rather denote the presence of at least one of the referenced item. The modifier "about" used in connection with a quantity is inclusive of the stated value and has the meaning dictated by the context (e.g., includes the degree of error associated with measurement of the particular quantity). The suffix "(s)" as used herein is intended to include both the singular and the plural of the term that it modifies, thereby including one or more of that term (e.g., the metal(s) includes one or more metals). Ranges disclosed herein are inclusive and independently combinable (e.g., ranges of "up to about 25 mm, or, more specifically, about 5 mm to about 20 mm," is inclusive of the endpoints and all intermediate values of the ranges of "about 5 mm to about 25 mm," etc.).

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of fabricating a bipolar transistor, the method comprising:
providing a substrate;
providing a stack of films disposed above the substrate, the stack of films including an intrinsic base over the substrate, a first oxide layer over the intrinsic base, an extrinsic base over the first oxide layer, a second oxide layer over the extrinsic base, a nitride layer over the second oxide layer, and a third oxide layer over the nitride layer;
forming a first opening in the third oxide layer, the nitride layer, and the second oxide layer, exposing a surface of the extrinsic base;
forming a spacer on a sidewall of the first opening;
forming a self-aligned oxide mask on the exposed surface of the extrinsic base;

removing the spacer;

using the self-aligned oxide mask, etching the exposed extrinsic base and the first oxide layer to expose the intrinsic base layer, forming a first slot and a second slot; and selectively growing a silicon layer stripe on at least one of the exposed intrinsic base layer and extrinsic base layer in each of the first slot and the second slot, wherein the silicon layer stripe in each of the first and second slots substantially fills the first and second slots.

2. The method of claim 1, wherein the extrinsic base comprises polysilicon.

3. The method of claim 2, forming the self-aligned oxide mask on the exposed surface of the extrinsic base further includes using HI Pressure OXidation (HIPDX) to oxidize the polysilicon extrinsic base.

4. The method of claim 1, wherein the intrinsic base comprises silicon germanium (SiGe).

5. The method of claim 1, wherein selectively growing the silicon layer stripe in each of the first slot and the second slot further comprises selectively growing one of Si and SiGe.

6. The method of claim 5, wherein selectively growing the silicon layer stripe in each of the first slot and the second slot further comprises in situ doping with boron.

7. The method of claim 1, wherein selectively growing the silicon layer stripe in each of the first slot and the second slot places the intrinsic base and the extrinsic base in electrical signal communication.

8. The method of claim 1, wherein the spacer comprises a nitride, and removing the spacers further comprises using one of a reactive ion etch and a wet etch using hot phosphoric acid.

9. The method of claim 1, wherein selectively growing the silicon layer stripe on the exposed intrinsic base layer in each of the first slot and the second slot further comprises adjusting a pressure in an environment.

10. A method of fabricating a bipolar transistor, the method comprising:

forming a first opening in at least one film disposed above an extrinsic base region to expose a surface of the extrinsic base region;

forming a spacer on a sidewall of the first opening;

forming a self-aligned oxide mask on the exposed surface of the extrinsic base;

removing the spacer;

using the self-aligned oxide mask, forming a self-aligned first slot and a self-aligned second slot extending vertically through a thickness of the exposed extrinsic base and a first oxide layer disposed below the extrinsic base to expose an intrinsic base layer; and selectively growing a silicon layer stripe on at least one of the exposed intrinsic base layer and the exposed extrinsic base layer in each of the first slot and the second slot, wherein the silicon layer stripe in each of the first and second slots substantially fills the first and second slots.

11. The method of claim 10, wherein the extrinsic base comprises polysilicon, and the self-aligned oxide mask comprises silicon oxide.

12. The method of claim 10, wherein the intrinsic base further comprises silicon germanium (SiGe).

13. The method of claim 10, wherein the selectively grown silicon layer stripe in each of the first slot and the second slot further comprises SiGe in situ doped with boron.

\* \* \* \* \*